US010516002B2

(12) United States Patent
Jo et al.

(10) Patent No.: US 10,516,002 B2
(45) Date of Patent: Dec. 24, 2019

(54) ORGANIC LIGHT EMITTING DISPLAY DEVICE

(71) Applicant: LG DISPLAY CO., LTD., Seoul (KR)

(72) Inventors: So-Young Jo, Paju-si (KR); Soo-Kang Kim, Paju-si (KR); Won-Hoe Koo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/116,405

(22) Filed: Aug. 29, 2018

(65) Prior Publication Data

US 2019/0067383 A1 Feb. 28, 2019

(30) Foreign Application Priority Data

Aug. 31, 2017 (KR) .................. 10-2017-0110899
Aug. 1, 2018 (KR) .................. 10-2018-0089922

(51) Int. Cl.
*H01L 27/32* (2006.01)
*H01L 51/52* (2006.01)

(52) U.S. Cl.
CPC ........ *H01L 27/3213* (2013.01); *H01L 27/322* (2013.01); *H01L 27/3262* (2013.01); *H01L 51/5209* (2013.01); *H01L 51/5275* (2013.01); *H01L 51/5284* (2013.01)

(58) Field of Classification Search
CPC ..... H01L 27/322; H01L 27/3244–3279; H01L 51/5284
See application file for complete search history.

(56) References Cited

U.S. PATENT DOCUMENTS

2012/0032583 A1* 2/2012 Kim ...................... H01L 27/322
                                                          313/504
2015/0380466 A1   12/2015 Koo et al.
2016/0087247 A1    3/2016 Kim

FOREIGN PATENT DOCUMENTS

EP         2416363 A1    2/2012
JP      2018-37391 A    3/2018

* cited by examiner

*Primary Examiner* — Daniel P Shook
(74) *Attorney, Agent, or Firm* — Birch, Stewart, Kolasch & Birch, LLP

(57) ABSTRACT

An organic light emitting display device includes a substrate including a plurality of pixel regions, a light absorption material layer in a white pixel region of the plurality of pixel regions and including a light absorption dye, an overcoat layer on the light absorption material layer, a micro-lens structure at a top surface of the overcoat layer, and an emitting diode on the micro-lens structure, wherein the light absorption dye has a main absorption wavelength of about 500 to 640 nm.

20 Claims, 9 Drawing Sheets

ORGANIC LIGHT EMITTING DISPLAY DEVICE

CROSS-REFERENCE TO RELATED APPLICATIONS

This application claims the priority benefit of Republic of Korea Patent Application No. 10-2017-0110899 filed in the Republic of Korea on Aug. 31, 2017, and Republic of Korea Patent Application No. 10-2018-0089922 filed on Aug. 1, 2018, all of which are hereby incorporated by reference in their entirety into the present application.

BACKGROUND OF THE INVENTION

Field of the Invention

Embodiments of the invention relate to an organic light emitting display device, and more particularly, to an organic light emitting display device having improved light out-coupling efficiency and improved color temperature.

Discussion of the Related Art

As information technology and mobile communication technology have been developed, a display device capable of displaying a visual image has also been developed.

Flat panel display devices, such as a liquid crystal display (LCD) device, a plasma display panel (PDP) device, a field emission display (FED) device, an electroluminescence display device (ELD), an organic light emitting display (OLED) device, and so on, are developed and used instead of a cathode ray tube because of advantages in weight, power consumption, and so on.

Among the flat panel display device, the OLED device as a self-emission type has excellent characteristics of thin profile and light weight without a backlight unit required in the LCD device. In addition, the OLED display device has advantages of viewing angle, contrast ratio, low power consumption, low-voltage driving and fast response time. Moreover, since the OLED device includes the solid elements, the OLED device has advantages in an outer impact and an operation temperature range.

Further, since the fabricating process of the OLED device is very simple, the OLED device has a big advantage in the production cost.

In the OLED device, the light loss of the light from an organic emitting layer is generated when the light passes through various elements in the OLED device. For example, the light extraction of the light from the organic emitting layer can be about 20%.

Since the light extraction amount is proportional to the current applied to an organic light emitting diode, the brightness of the OLED device can be increased by increasing the current to the organic light emitting diode. However, it causes high power consumption and short lifespan.

To improve the light out-coupling (light extraction) of the OLED device, a micro-lens array (MLA) can be attached onto a substrate of the OLED device or a micro-lens can be formed in an overcoat layer of the OLED device.

However, the color temperature of the OLED device can be decreased by the MLA or the micro-lens. In addition, the reflection ratio is increased by the MLA or the micro-lens such that the visual sensitivity of color black can be decreased.

SUMMARY OF THE INVENTION

Accordingly, embodiments of the invention are directed to an OLED device that substantially obviates one or more of the problems due to limitations and disadvantages of the related art, and have other advantages.

Additional features and advantages of the invention will be set forth in the description which follows, and in part will be apparent from the description, or can be learned by practice of the invention. The objectives and other advantages of the invention will be realized and attained by the structure particularly pointed out in the written description and claims hereof as well as the appended drawings.

Embodiments relate to an organic light emitting display device includes a substrate including a plurality of pixel regions, a light absorption material layer in a white pixel region of the plurality of pixel regions and including a light absorption dye, an overcoat layer on the light absorption material layer, a micro-lens structure at a top surface of the overcoat layer, and an emitting diode on the micro-lens structure, wherein the light absorption dye has a main absorption wavelength of about 500 to 640 nm.

In another aspect, an organic light emitting display device includes a substrate including a first pixel region of red or green and a second pixel region of white; an emitting diode on the substrate and corresponding to the first and second pixel regions, the emitting diode emitting a white light; a color filter in the first pixel region and between the substrate and the emitting diode; and a blue color filter pattern on the substrate and under the emitting diode, wherein the blue color filter pattern is positioned between the first and second pixel regions.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

Figure 1:
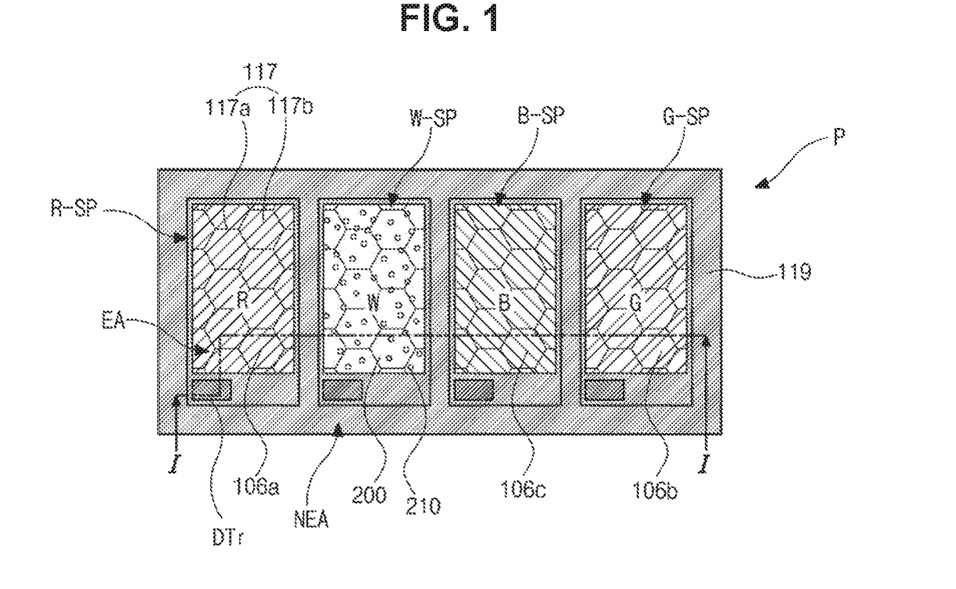
FIG. 1 is a schematic plane view of a pixel of an OLED device according to a first embodiment of the present invention.
Figure 2:
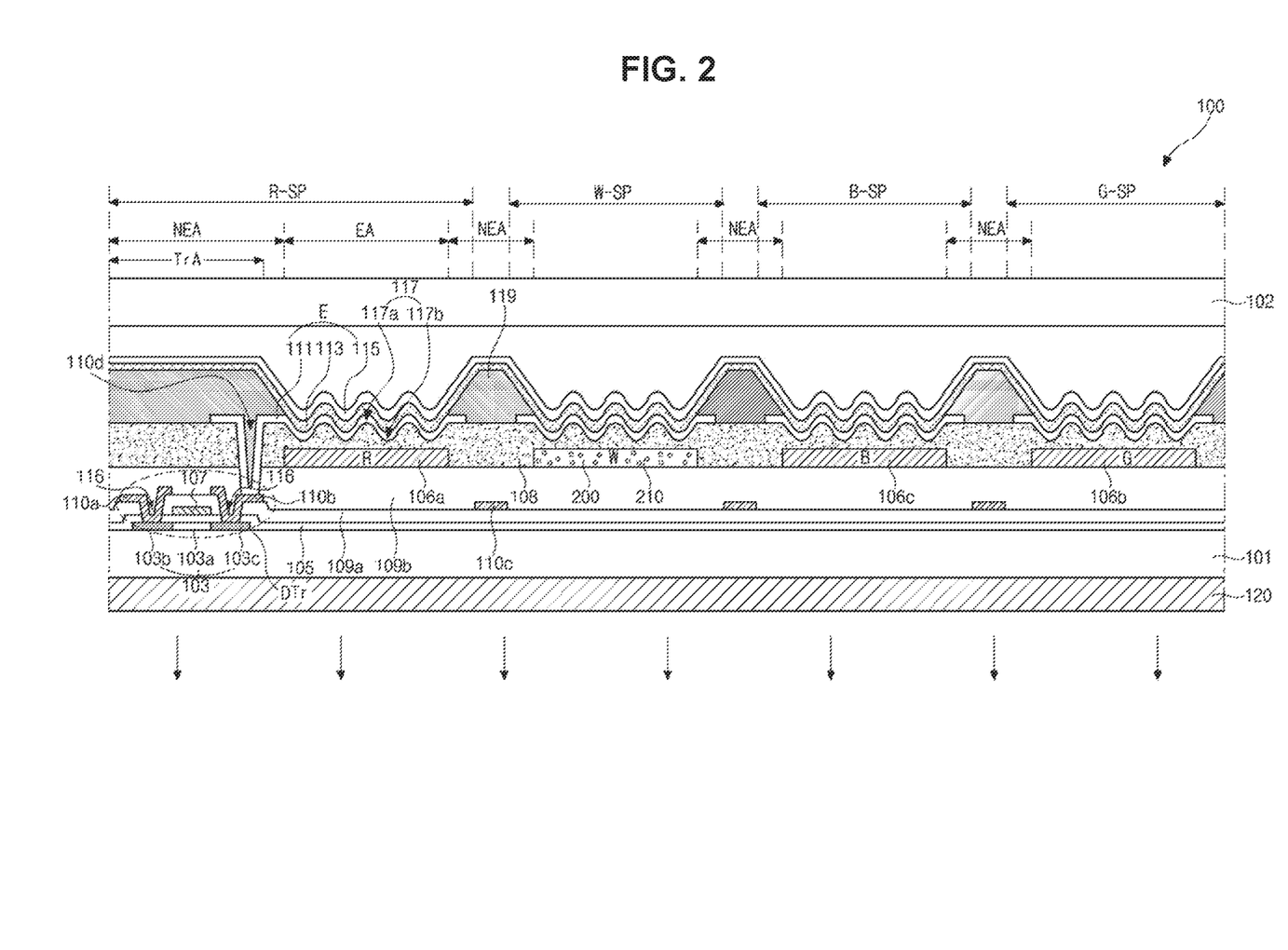
FIG. 2 is a schematic cross-sectional view taken along the line I-I of FIG. 1.

FIG. 1 is a schematic plane view of a pixel of an OLED device according to a first embodiment of the present invention. FIG. 2 is a schematic cross-sectional view taken along the line I-I of FIG. 1. All the components of the OLED device according to all embodiments of the present invention are operatively coupled and configured.

Referring to FIG. 1, an OLED device 100 (of FIG. 2) includes a plurality of pixels P are included. Each or at least one of the pixels P includes a red pixel region R-SP, a white pixel region W-SP, a blue pixel region B-SP and a green pixel region G-SP. Each of the pixel regions R-SP, W-SP, B-SP and G-SP includes an emission area EA and a non-emission area NEA along an edge of the emission area EA. Namely, the non-emission area NEA is disposed at a periphery of the emission area EA. A bank 119 is disposed in the non-emission area NEA. Namely, the bank 119 is disposed at a boundary of each of the pixel regions R-SP, W-SP, B-SP and G-SP.

In FIG. 1, the pixel regions R-SP, W-SP, B-SP and G-SP have the same width and are arranged along a direction. Alternatively, the pixel regions R-SP, W-SP, B-SP and G-SP can have different widths (areas) and can be arranged to form various structures.

A driving thin film transistor (TFT) DTr is formed in the non-emission area NEA of each pixel region R-SP, W-SP, B-SP and G-SP. A light emitting diode E (of FIG. 2), which includes a first electrode 111 (of FIG. 2), an organic emitting layer 113 (of FIG. 2) and a second electrode 115 (of FIG. 2), is formed in the emission area EA of each pixel region R-SP, W-SP, B-SP and G-SP.

To emit (or display) red "R", white "W", blue "B" and green "G" lights in the pixel regions R-SP, W-SP, B-SP and G-SP, respectively, a red color filter 106a, a light absorption material layer 200, a blue color filter 106c and a green color filter 106b are formed in the emission area EA of the red, white, blue and green pixel regions R-SP, W-SP, B-SP and G-SP.

A plurality of micro-lens structures 117 are also formed in each pixel region R-SP, W-SP, B-SP and G-SP. A shape of the micro-lens structure 117 in each emission area EA can be the same as each other. An external out-coupling efficiency of the organic emitting layer 113 is improved by the micro-lens structure 117.

The micro-lens structure 117 is formed on a surface of an overcoat layer 108 (of FIG. 2) and includes a plurality of concave portions 117b and a plurality of convex portions 117a adjacent to the concave portion 117b. Namely, the convex portion 117a and the concave portion 117b are alternately arranged with each other.

The light absorption material layer 200 in the white pixel region W-SP includes a white or a transparent binder resin and a light absorption dye 210 dispersed in the binder resin. The light absorption dye 210 has a main (major) absorption wavelength of about 500 to 640 nm.

The yellow light is absorbed by the light absorption dye 210 such that the color temperature of the OLED device 100 is improved. In addition, the reflection ratio is decreased by the light absorption dye 210 such that the visual sensitivity of the black color is improved.

More specifically, FIG. 2 is a schematic cross-sectional view taken along the line I-I of FIG. 1.

The OLED device can be classified into a top emission type and a bottom emission type depending on a passing direction of the light from the emitting diode. Hereinafter, the bottom emission type OLED device is explained, but it is not limited thereto.

For the sake of explanation, a region, where the driving TFT DTr is formed, is defined as a switching region TrA, and a region, where the emitting diode E is formed, is defined as the emission area EA.

Referring to FIG. 2, the driving TFT DTr is formed in one pixel region R-SP. However, the driving TFT DTr is formed in all of the pixel regions R-SP, W-SP, B-SP and G-SP.

Each or one pixel P (of FIG. 1) is defined by adjacent four pixel regions R-SP, W-SP, B-SP and G-SP along a direction, and the four pixel regions are respectively defined as the red, white, blue and green pixel regions R-SP, W-SP, B-SP and G-SP.

As shown in FIG. 2, a substrate 101, where the driving TFT DTr and the emitting diode E are formed, is encapsulated by a protection film 102.

A semiconductor layer 103 is disposed on the substrate 101 and in a region TrA. The semiconductor layer 103 is formed of silicon. A center of the semiconductor layer 103 is defined as an active region 103a as a channel. High-concentration impurity is doped at both sides of the semiconductor layer 103 such that a source region 103b and a drain region 103c are defined at both sides of the active region 103a.

A gate insulating layer 105 is disposed on the semiconductor layer 103.

A gate electrode 107, which corresponds to the active region 103a of the semiconductor layer 103, and a gate line, which extends along a direction, are disposed on the gate insulating layer 105.

A first interlayer insulating layer 109a is disposed on the gate electrode 107 and the gate line. First and second semiconductor contact holes 116, which respectively expose the source region 103b and the drain region 103c, are formed through the first interlayer insulating layer 109a and the gate insulating layer 105.

A source electrode 110a and a drain electrode 110b, which are spaced part from each other, are disposed on the first interlayer insulating layer 109a. The source electrode 110a and the drain electrode 110b respectively contact the source region 103b and the drain region 103c through the first and second semiconductor contact holes 116.

A second interlayer insulating layer 109b is disposed on the source electrode 110a, the drain electrode 110b and the first interlayer insulating layer 109a between the source and drain electrodes 110a and 110b.

The source electrode 110a, the drain electrode 110b, the semiconductor layer 103, the gate electrode 107 constitute the driving TFT DTr.

In addition, a data line 110c, which crosses the gate line to define the pixel regions R-SP, W-SP, B-SP and G-SP, and a switching TFT, which has similar structure as the driving TFT DTr and is connected to the driving TFT DTr, are further disposed.

In FIG. 2, the semiconductor layer 103 is formed of polycrystalline silicon or an oxide semiconductor material, and the driving TFT DTr has a top-gate structure. Alternatively, the semiconductor layer can be formed of intrinsic amorphous silicon and impurity-doped amorphous silicon, and the driving TFT DTr can have a bottom-gate structure.

When the semiconductor layer 103 is formed of the oxide semiconductor material, a light-shielding layer can be disposed under the semiconductor layer 103. The light-shielding layer can be positioned between the semiconductor layer 103 and a buffer layer on the substrate 101.

In addition, the color filters 106a, 106b and 106c, which respectively correspond to the red, green and blue pixel regions R-SP, G-SP and B-SP, and the light absorption material layer 200, which corresponds to the white pixel region W-SP, are disposed on the second interlayer insulating layer 109b and in the emission area EA.

The white light from the organic emitting layer 113 is filtered or converted by the red, green and blue color filters 106a, 106b and 106c in the red, green and blue pixel regions R-SP, G-SP and B-SP.

The light absorption material layer 200 in the white pixel region W-SP includes a white or a transparent binder resin and at least one light absorption dye 210 dispersed in the binder resin. The binder resin can be formed of at least one material selected from the group consisting of a polyester-based resin, an acryl-based resin, a polyurethane-based resin, a melamine-based resin, a polyvinylalcohole-based resin and an oxazole-based resin. It can be preferred that the binder resin is the acryl-based resin.

The light absorption dye 210 has a pre-determined absorption wavelength. A main (major) absorption wavelength of the light absorption dye 210 is about 500 to 640 nm. The light absorption dye 210 can include one or more of tetra-aza-porphyrin (TAP), rhodamine, squalene and cyanine (CY)-based material. For example, the light absorption dye 210 can have a weight % of about 10 to 30 with respect to the binder resin. When the light absorption dye 210 has a weight % less than 10, the absorption ratio in the pre-determined absorption wavelength is too low such that there can be no increase of the color temperature. On the other hand, when the light absorption dye 210 has a weight % above than 30, the transmittance is decreased such that the emitting efficiency is lowered.

In the OLED device 100 including the light absorption material layer 200 in the white pixel region W-SP, the color temperature and the black visual sensitivity are improved.

An overcoat layer 108 is disposed on the color filters 106a, 106b and 106c and the light absorption material layer 200. A drain contact hole 110d, which exposes the drain electrode 110b, is formed through the overcoat layer 108 and the second interlayer insulating layer 109b. A surface of the overcoat layer 108 provides a plurality of concave portions and a plurality of convex portions such that the micro-lens structure 117 is provided.

The overcoat layer 108 is formed of an insulating material having a refractive index of about 1.5. For example, the overcoat layer 108 can be formed of an acryl-based resin, a phenol-based resin, a polyamide-based resin, a polyimide-based resin, a unsaturated-polyester-based resin, a polyphenylene-based resin, a polyphenylenesulfide-based resin, a benzocyclobutene-based resin or photoresist, but it is not limited thereto.

Since the micro-lens structure 117 is provided by the surface of the overcoat layer 108, the light out-coupling efficiency of the OLED device 100 is improved.

The first electrode 111, which is connected to the drain electrode 110b through the drain contact hole 110d, is disposed on the overcoat layer 108. The first electrode 111 can be formed of a conductive material having a relatively high work function to serve as an anode.

For example, the first electrode 111 can be formed of a metal oxide material, e.g., indium-tin-oxide (ITO) or indium-zinc-oxide (IZO), a mixture of metal and oxide, e.g., ZnO:Al or SnO2:Sb, or a conductive polymer, e.g., poly(3-methylthiophene), poly[3,4-(ethylene-1,2-dioxy)thiophene] (PEDT), polypyrrole, or polyaniline. In addition, the first electrode 111 can be formed of carbon nano tube (CNT), graphene or silver nano wire.

The first electrode 111 is separated in each pixel region R-SP, W-SP, B-SP and G-SP. The bank 119 is disposed between adjacent first electrodes 111. Namely, the first electrodes 111 in the pixel regions R-SP, W-SP, B-SP and G-SP are separated by the bank 119 in the boundary of the pixel regions R-SP, W-SP, B-SP and G-SP.

The organic emitting layer 113 is disposed on the first electrode 111. The organic emitting layer 113 can have a single-layered structure of an emitting material. Alternatively, to improve the emitting efficiency, the organic emitting layer 113 can have a multi-layered structure of a hole injection layer, a hole transporting layer, an emitting material layer, an electron transporting layer and an electron injection layer.

The second electrode 115 is disposed on the organic emitting layer 113 and over an entire surface of the substrate 101. The second electrode 115 can be formed of a conductive material having a relatively low work function to serve as a cathode. For example, the second electrode 115 can include Ag, Mg or their alloy.

When the voltages are applied to the first and second electrode 111 and 115, a hole from the first electrode 111 and an electron from the second electrode 115 are transferred into the organic emitting layer 113 to form an exciton. The exciton is transited from an excited state into a ground state such that the light is emitted from the emitting diode E.

The light from the emitting diode E passes through the first electrode 111 such that the OLED device 100 displays an image.

The concave portion 117b and the convex portion 117a on the surface of the overcoat layer 108 are reflected onto the first electrode 111, the organic material layer 113 and the second electrode 115 sequentially stacked on the overcoat layer 108 such that the micro-lens structure 117 is provided.

The protection film 102 as a thin film is formed on or over the driving TFT DTr and the emitting diode E such that the OLED device 100 is encapsulated by the protection film 102.

The penetration of external oxygen and/or moisture is blocked by the protection film 102. The protection film 102 can include at least two inorganic protection films. An organic protection film can be interposed between two inorganic protection films to improve an anti-impact property of the protection film 102.

To block the penetration of external oxygen and/or moisture through a side surface of the organic protection film, the side surface of the organic protection film can be completely covered by the inorganic protection film.

Accordingly, the penetration of external oxygen and/or moisture into the inner side of the OLED device 100 is prevented.

In addition, a polarization plate 120 can be disposed or attached on an outer side of the substrate 101 to prevent contrast ratio decrease by an ambient light reflection.

Namely, the polarization plate 120 is positioned in a light path from the organic emitting layer 113 when the OLED device 100 is driven such that the contrast ratio of the OLED device 100 is improved.

For example, the polarization plate 120 can be a circular polarization plate. The polarization plate 120 can include a retardation plate and a linear polarization plate. The retardation plate can be positioned between the substrate 101 and the linear polarization plate.

The retardation plate can be a quarter wave plate (¼λ plate, QWP). The linear polarization plate has a polarization axis, and the light is linearly-polarized along a direction of the polarization axis.

In addition, a surface modification layer can be disposed at an outer side of the linear polarization plate. The surface modification layer can be an anti-glare layer including a silica bead or a hard coating layer preventing a damage on the polarization plate 120.

As mentioned above, in the OLED device 100 according to the first embodiment of the present invention, since the surface of the overcoat layer 108 forms the micro-lens structure 117 including the concave portion 117b and the convex portion 117a, the light out-coupling efficiency is improved.

Namely, a part of the light from the organic emitting layer 113 is totally reflected between the organic emitting layer 113 and the second electrode 115 such that the light is trapped in the space between the organic emitting layer 113 and the second electrode 115. However, in the OLED device 100 of the present invention, the light is incident to the micro-lens structure 117 in an angle being smaller than a critical angle of the total reflection such that the external emitting efficiency is increased by the multiple reflections. Accordingly, the light out-coupling efficiency of the OLED device 100 is improved.

In addition, since the light absorption material layer 200 in the white pixel region W-SP includes the light absorption dye 210 having a main absorption wavelength of about 500 to 640 nm, the color temperature of the OLED device 100 is improved and the black visual sensitivity is also improved.

Generally, the chromaticity of the light source or the reference white color can be defined by a temperature of a closest region in the radiation curve instead of the coordinate in the 2 dimension color coordinate. It may be referred to as a correlated color temperature (CCT) or a color temperature.

The color temperature is used as a reference showing which color is closer to the white color. When the color of the display device is closer to the blue color, the color temperature is relatively high. When the color of the display device is closer to the yellow color, the color temperature is relatively low. The display device can provide high quality image (or color) with high color temperature.

To provide high quality image (color) in the display device using an emitting diode emitting white light, it is preferred that the color temperature of the white light is high. Accordingly, the color temperature of the white light above about 7000K is required.

The color coordinate (CIE), the brightness efficiency (cd/A) and the color temperature in a white pixel region W-SP and the power consumption [W] of the standard moving image in a general OLED device without a micro-lens structure ("Sample 1") and an OLED device including the micro-lens structure without a light absorption material layer ("Sample 2") are measured and listed in Table 1.

TABLE 1

|     |   | Sample 1 | Sample 2 |
|-----|---|----------|----------|
| CIE | X | 0.290 | 0.326 |
|     | Y | 0.316 | 0.336 |
| cd/A |  | 35.1 | 46.9(+33%) |
| Color temperature | | 7000K | 5800K |
| Power consumption | R | 1.35 | 0.64(−53%) |
|     | G | 0305 | 0.98(+3%) |
|     | B | 1.41 | 1.47(+4%) |
|     | W | 0.55 | 1.07(−31%) |

Referring to Table 1, in comparison to "Sample 1", the brightness efficiency (optical efficiency) of "Sample 2" is increased by 33%. However, the color temperature 5800K of "Sample 2" is lower than the color temperature 7000K of "Sample 1".

To increase the color temperature of "Sample 2", the emitting intensity in the blue pixel region can be increased. However, disadvantages in the power consumption and the lifespan are caused such that the efficiency of the display panel is decreased.

On the other hand, in the OLED device 100 according to the first embodiment of the present invention, even though the micro-lens structure 117 is formed on the surface of the overcoat layer 108 to improve the light out-coupling efficiency, the OLED device 100 has high color temperature such that high quality display can be provided.

Namely, the OLED device 100 includes the light absorption material layer 200 including the light absorption dye 210 in the white pixel region W-SP such that the color temperature is increased.

The color coordinate (CIE), the brightness efficiency (cd/A) and the color temperature in a general OLED device without a micro-lens structure ("Sample 1"), an OLED device including the micro-lens structure without a light absorption material layer ("Sample 2"), and an OLED device including the micro-lens structure and the light absorption material layer ("Sample 3") according to the embodiment(s) of the present invention are measured and listed in Table 2. The color coordinate, the brightness efficiency and the color temperature are measured in the white pixel region W-SP.

TABLE 2

|     |   | Sample 1 | Sample 2 | Sample 3 |
|-----|---|----------|----------|----------|
| CIE | X | 0.290 | 0.326 | 0.291 |
|     | Y | 0.316 | 0.336 | 0.308 |
| cd/A |  | 35.1 | 46.9(+33%) | 40.4(+15%) |
| Color temperature | | 7000K | 5800K | 9800K |

Referring to Table 2, the brightness efficiency of "Sample 3" is lower than that of "Sample 2". However, in comparison to "Sample 1", the brightness efficiency of "Sample 3" is increased by 15%. In addition, the color temperature 9800K of "Sample 3" is higher than the color temperature 7000K of "Sample 1" as well as the color temperature 5800K of "Sample 2".

Namely, in the OLED device 100 of the first embodiment of the present invention, since the micro-lens structure 117 is provided on the surface of the overcoat layer 108, the light out-coupling efficiency is improved. In addition, since the light absorption material layer 200 including the light absorption dye 210 is provided in the white pixel region W-SP, the color temperature is improved.

As mentioned above, since the light absorption dye 210 in the light absorption material layer 200 has the main absorption wavelength of about 500 to 640 nm, the yellow light in the white light from the emitting diode E is absorbed by the light absorption material layer 200.

Figure 3:
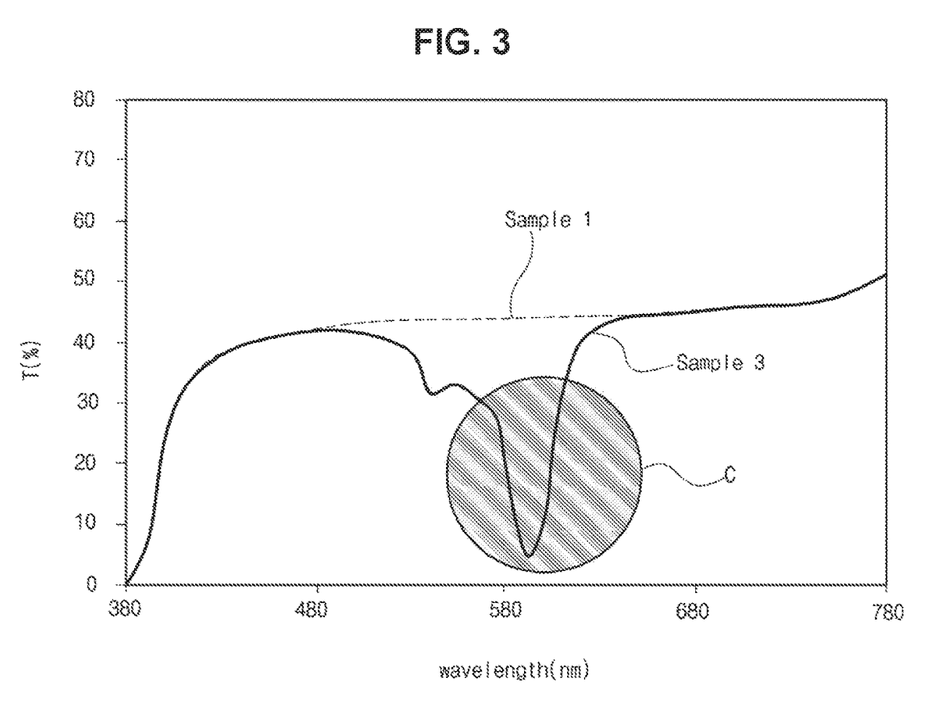
FIG. 3 is a graph showing an emission spectrum of an OLED device of the present invention and an OLED device of a related art.

Referring to FIG. 3, the general OLED device "Sample 1" has a substantially uniform transmittance (T) in an entire visible ray range, while the OLED device "Sample 3" of the present invention has a lower transmittance in a "C" region.

Namely, since the light absorption dye 210, which has a main absorption wavelength range of about 500 to 640 nm and a peak absorption wavelength range of about 580 to 620 nm, is included in the light absorption material layer 200 in the white pixel region W-SP, the transmittance in the wavelength range of about 500 to 640 nm, particularly, about 580 to 620 nm is lowered. In other words, in the OLED device 100, the light in the wavelength range of about 500 to 640 nm is partially absorbed such that the white light is blue-shifted and high color temperature is provided.

For example, the white light emitted in the white pixel region W-SP in the OLED device 100 has the CIE(X) of 0.291 and the CIE(Y) of 0.308 or the color coordinate index being shift into a lower-left direction in the color coordinate.

The proportion of the blue light in the white light is increased such that the color temperature of the white light is increased.

Accordingly, the OLED device 100 ("Sample 3") of the present invention provides high color temperature white light such that the color quality of the image is improved.

In addition, since the color temperature of the OLED device 100 is increased, the brightness in the full-white gray level is improved in comparison to the OLED device with the micro-lens structure without the light absorption material layer.

TABLE 3

|  |  |  | Sample 1 | Sample 2 | Sample 3 |
|---|---|---|---|---|---|
| WS | CIE | X | 0.290 | 0.326 | 0.291 |
|  |  | u | 0.316 | 0.336 | 0.308 |
|  | Cd/A |  | 35.1 | 46.9(+33%) | 40.4(+15%) |
| Brightness in WCT | Full |  | 193 | 178(−8%) | 269(+39%) |
|  | ¼ |  | 726 | 687(−5%) | 1000(+38%) |

Referring to Table 3, the brightness efficiency (cd/A) of "Sample 3" is lower than that of "Sample 2". However, the brightness of "Sample 3" in the WCT is higher than that of "Sample 2".

In Table 3, the color coordinate index and the brightness efficiency is measured in the white pixel region W-SP "WS". For instance, "WS" preferably means that only the white pixel region is driven. The brightness in the WCT (white color tracking) is measured with driving the white pixel region W-SP, the green pixel region G-SP and the blue pixel region B-SP without the red pixel region R-SP. In addition, "Full" preferably means that the white pixel region W-SP, the green pixel region G-SP and the blue pixel region B-SP in an entire display area (active area) are driven, and "¼" preferably means that the white pixel region W-SP, the green pixel region G-SP and the blue pixel region B-SP in ¼ of an entire display area are driven.

Namely, to do the white color tracking for testing a color temperature in a full-white gray level, the white pixel region W-SP, the green pixel region G-SP and the blue pixel region B-SP are driven. In the OLED device including the micro-lens structure without a light absorption material layer ("Sample 2"), the color temperature is low such that the contribution of the blue pixel region should be increased to improve the color temperature.

Accordingly, in the OLED device of "Sample 2", the power consumption is increased, and the lifespan of the emitting diode E in the blue pixel region is reduced such that the efficiency of the OLED device is decreased.

As a result, when the full-white gray is provided, in comparison to the general OLED device of "Sample 1", the brightness of the OLED device of "Sample 2", which includes the micro-lens structure without a light absorption material layer, is lowered by about 8%.

However, since the color temperature of the OLED device of "Sample 3" of the present invention is improved, it is not required to over-drive the blue pixel region. Accordingly, in comparison to the OLED device of "Sample 1" and "Sample 2", the brightness of the OLED device of "Sample 3" according to the present invention is greatly improved.

As mentioned above, in the OLED device 100 of the present invention, the micro-lens structure 117 is provided on the overcoat layer 108 such that the light out-coupling efficiency is improved. In addition, the light absorption material layer 200 including the light absorption dye 210 is provided in the white pixel region W-SP such that the color temperature is increased. Accordingly, the OLED device 100 provides high quality color (or image) with high efficiency.

On the other hand, when the light absorption material layer is provided in the white pixel region of the general OLED device without the micro-lens structure, the brightness efficiency and the brightness are decreased.

TABLE 4

|  |  |  | Sample 1 | Sample 3 | Sample 4 |
|---|---|---|---|---|---|
| WS | CIE | X | 0.290 | 0.291 | 0.255 |
|  |  | u | 0.316 | 0.308 | 0.284 |
|  | Cd/A |  | 35.1 | 40.4(+15%) | 28.1(−19%) |
| Brightness in WCT | Full |  | 193 | 269(+39%) | 132(−31%) |
|  | ¼ |  | 726 | 1000(+38%) | 504(−30%) |

In Table 4, the OLED device of "Sample 4" includes the light absorption material layer, which includes the light absorption dye, without the micro-lens structure.

As shown in Table 4, the OLED device of "Sample 4" has the brightness efficiency being lower than the OLED device of "Sample 1". Particularly, in the full white gray level, the brightness is remarkably lowered by about 30%.

In addition, in comparison to the OLED device "Sample 3" of the present invention, the brightness in the WCT of the OLED device of "Sample 4" is lowered by about 50%.

Namely, the OLED device 100 is preferred to include both the micro-lens structure 117 on the overcoat layer 108 and the light absorption material layer 200 in the white pixel region W-SP to provide high efficiency and high color temperature.

In addition, the black visual sensitivity of the OLED device 100 is improved.

Generally, the reflectance in the white pixel region W-SP is higher than that in the red, green and blue pixel regions R-SP, G-SP and B-SP respectively including the red, green and blue color filters 106a, 106b and 106c, and the black visual sensitivity is degraded by the reflected light in the white pixel region W-SP.

In addition, since the light diffusion component is increased by the micro-lens structure 117, the effect of the color filters 106a, 106b and 106c is generated by the light diffusion component. As a result, the black visual sensitivity is further degraded.

On the other hand, the visual sensitivity is highest in a green wavelength range. Namely, the view is most sensitive to the light of about 550 nm in the green wavelength range.

However, since the OLED device 100 includes the light absorption material layer 200 including the light absorption dye 210, which has a main absorption wavelength of about 500 to 640 nm, in the white pixel region W-SP, the light in the wavelength range of about 500 to 640 nm is absorbed by the light absorption material layer 200 such that the reflectance and the light diffusion component in the white pixel region W-SP are decreased. As a result, the black visual sensitivity is improved.

TABLE 5

|  | $R_{avg}$ (%) | $R_{550\,nm}$ (%) | $L_D$ (%) |
| --- | --- | --- | --- |
| Sample 2 | 2.3 | 1.5 | 2.63 |
| Sample 3 | 2.1 | 1.3 | 1.78 |

In Table 5, "Ravg" is an average reflectance, and "R550 nm" is a reflectance in the wavelength of 550 nm. "LD" is a value converting an average reflectance with the luminosity curve in the CIE Lab color space. The "Ravg", "R550 nm" and "LD" are measured in all of the red, green, blue and white pixel regions.

As shown in Table 5, in comparison to "Sample 2", the reflectance in "Sample 3" is lowered. The "Ravg" is lowered by about 9%, the "R550 nm" is lowered by about 13%, and the "LD" is lowered by about 32%.

Namely, in the OLED device 100, the micro-lens structure 117 on the overcoat layer 108 and the light absorption material layer 200 including the light absorption dye 210, which has a main absorption wavelength of about 500 to 640 nm, in the white pixel region W-SP are provided, the reflectance and the light diffusion component in the white pixel region W-SP are decreased. As a result, the color temperature and the black visual sensitivity are improved such that the optical efficiency of the OLED device 100 is improved and high quality color image is provided.

FIGS. 4A to 4E are schematic plane views of a white pixel region of an OLED device according to an embodiment of the present invention.

As mentioned above, the light absorption material layer 200 in the white pixel region W-SP is white or transparent and includes the light absorption dye 210 having a main absorption wavelength of about 500 to 640 nm. Namely, the light of 500 to 640 nm (e.g., yellow light) is absorbed by the light absorption material layer 200 such that the color temperature is increased. In addition, the reflectance is reduced by the light absorption material layer 200 such that the black visual sensitivity is improved.

As shown in FIGS. 4A to 4E, the light absorption material layer 200 includes a plurality of patterns and has an area being smaller than the emission area EA of the white pixel region W-SP. The area of the light absorption material layer 200 can be equal to or greater than 40% of the emission area EA of the white pixel region W-SP.

The color temperature of the OLED device of the present invention according to the area ratio of the light absorption material layer to the emission area of the white pixel region is measured and list in Table 6.

TABLE 6

| Area of light absorption material layer | Sample 3 |
| --- | --- |
| 100% | 9800K |
| 70% | 8600K |
| 40% | 7500K |
| 0% | 5800K |

Referring to Table 6, when the light absorption material layer is formed to correspond to an entire emission area of the white pixel region (100%), the color temperature is very high. (9800K).

Since the color temperature of the white light around 7000K is required, the light absorption material layer has the area ratio being equal to or greater than about 40%. For example, the area of the light absorption material layer can be about 40 to 70% of the emission area of the white pixel region. When the area of the light absorption material layer 200 is too large (e.g., above 70% of the area of the emission area of the white pixel region), the OLED device 100 has too high color temperature such that the color quality of the OLED device 100 can be degraded.

On the other hand, the red, green and blue color filters 106a, 106b and 106c have substantially the same area as the emission area EA in the red, green and blue pixel regions R-SP, G-SP and B-SP.

Figure 4A:
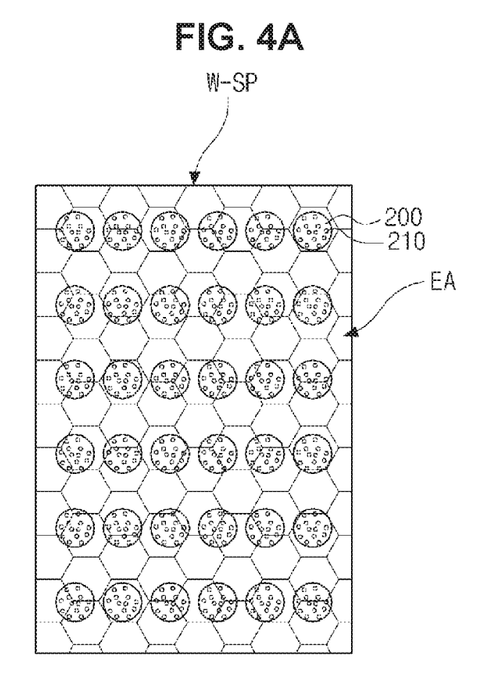
FIGS. 4A to 4E are schematic plane views of a white pixel region of an OLED device according to an embodiment of the present invention.

Referring to FIG. 4A, in the emission area EA of the white pixel region W-SP, the light absorption material layer 200 including the light absorption dye 210 includes a plurality of light absorption material patterns being spaced apart from each other. The light absorption material pattern has a circular shape. Alternatively, the light absorption material pattern can have a rectangular or square shape. However, the shape of the light absorption material pattern is not limited thereto.

Figure 4B:
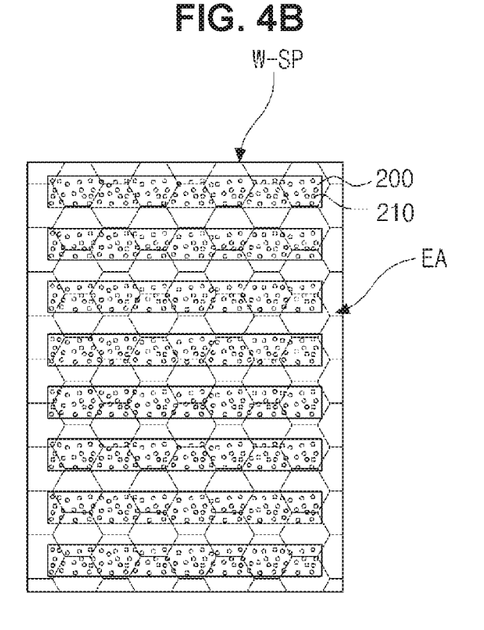
Figure 4C:
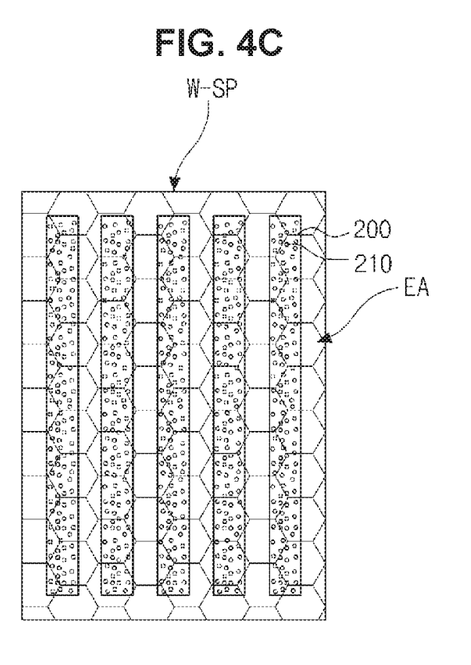

Referring to FIGS. 4B and 4C, in the emission area EA of the white pixel region W-SP, the light absorption material layer 200 including the light absorption dye 210 includes a plurality of light absorption material patterns having a bar shape and being spaced apart from each other. Namely, the plurality of light absorption material patterns are arranged along a first direction (FIG. 4B) or a second direction, which is perpendicular to the first direction, (FIG. 4C) to have a stripe structure. In this instance, as shown in FIG. 4E, a side surface of the bar-shaped light absorption material pattern can have a convex shape and a concave shape (i.e., uneven shape).

Figure 4D:
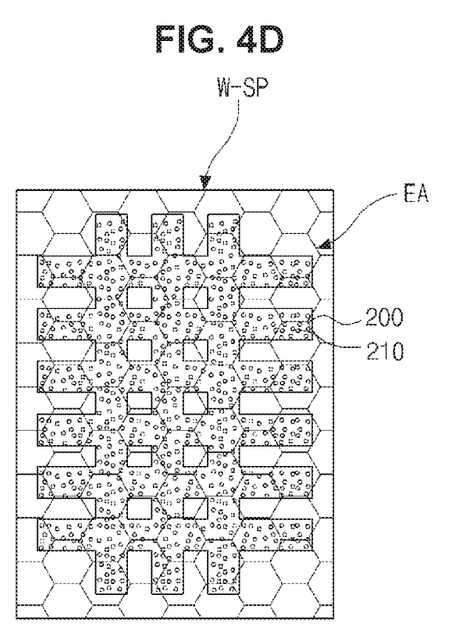
Figure 4E:
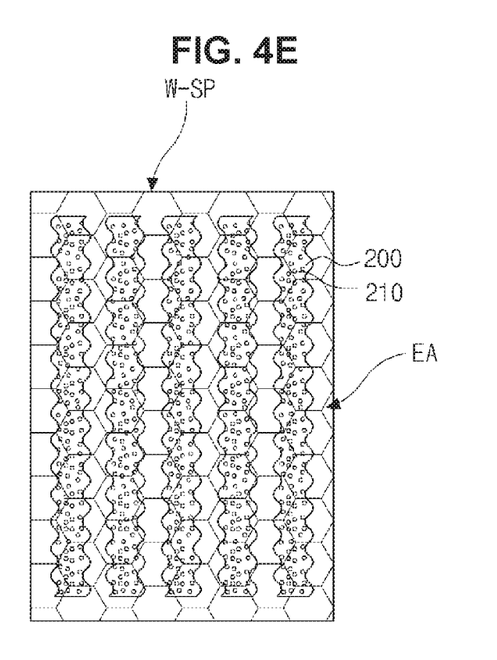

Referring to FIG. 4D, in the emission area EA of the white pixel region W-SP, the light absorption material layer 200 including the light absorption dye 210 has a lattice shape including an opening therein.

Namely, the light absorption material patterns cover a part of the emission area EA and expose the other part of the emission area EA between adjacent light absorption material patterns. The light absorption material layer 200 has an area being smaller than the emission area EA of the white pixel region W-SP and includes a plurality of light absorption material patterns or a lattice shape such that the light uniformity (or optical uniformity) in the white pixel region W-SP is improved.

For example, when light absorption material layer 200 having an area smaller than the emission area EA of the white pixel region W-SP is positioned at a side of the emission area EA or at a center of the emission area EA, there is a difference in the light property between a portion with the light absorption material layer 200 and the other portion without the light absorption material layer 200.

However, for example, when the light absorption material layer 200 includes a plurality of light absorption material patterns being spaced apart from each other as shown in FIG. 4A, a portion with the light absorption material pattern and the other portion without the light absorption material pattern are alternately arranged such that the light property difference is compensated. As a result, the decreased of the light property uniformity in the white pixel region W-SP is prevented.

The micro-lens structure 117 having a circular shape is shown. However, it is not limited thereto. For example, the micro-lens structure 117 can have a hexagonal shape or an oval shape.

Figure 5:
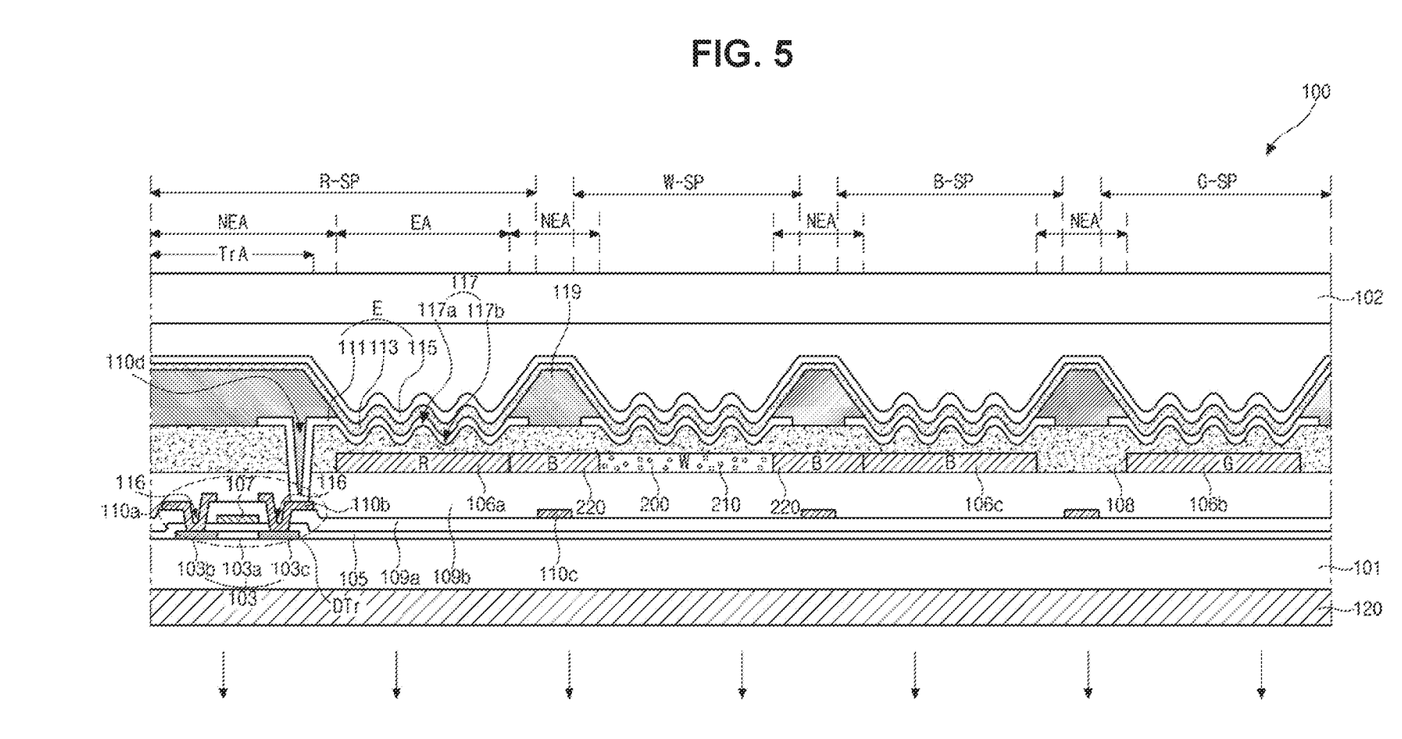
FIG. 5 is a schematic cross-sectional view of a pixel of an OLED device according to a second embodiment of the present invention.
Figure 6:
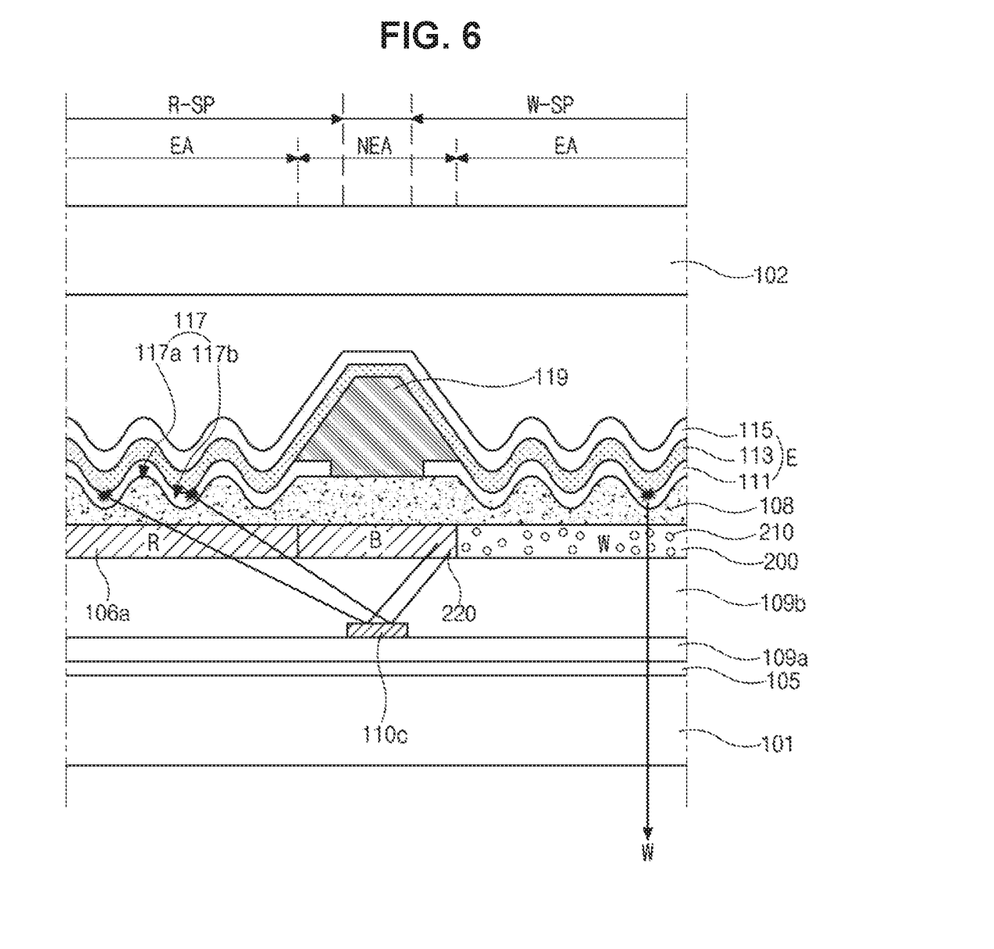
FIG. 6 is a view illustrating a light blocking structure in the OLED device of the second embodiment of the present invention.
Figure 7:
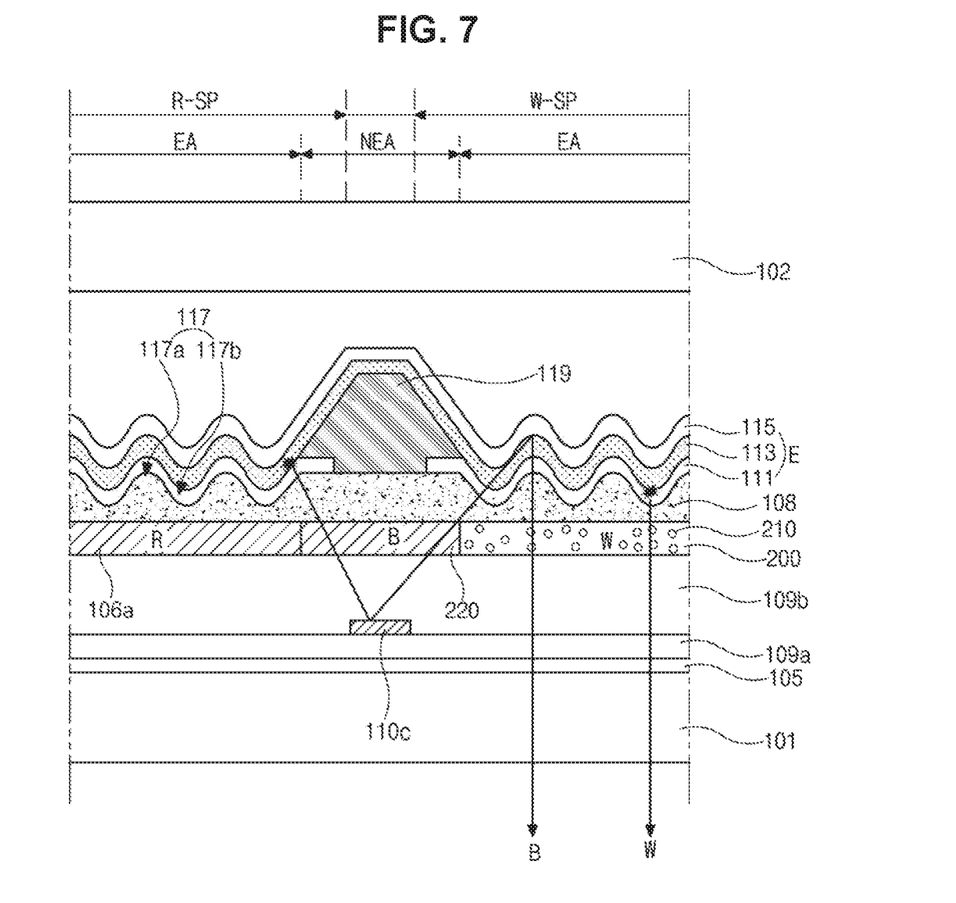
FIG. 7 is a view illustrating a light guiding path in the OLED device of the second embodiment of the present invention.

FIG. 5 is a schematic cross-sectional view of a pixel of an OLED device according to a second embodiment of the present invention. FIG. 6 is a view illustrating a light blocking structure in the OLED device of the second embodiment of the present invention, and FIG. 7 is a view illustrating a light guiding path in the OLED device of the second embodiment of the present invention.

As shown in FIG. 5, in the OLED device 100 according to the second embodiment of the present invention, a substrate 101, where the driving TFT DTr and the emitting diode E are formed, is encapsulated by a protection film 102.

The driving TFT DTr is positioned in a region TrA of each of the red, green, blue and white pixel regions R-SP, G-SP, B-SP and W-SP. The driving TFT DTr includes the source electrode 110a, the drain electrode 110b, the semiconductor layer 103 including the source region 103b and the drain region 103c and the gate electrode 107.

The first interlayer insulating layer 109a is disposed on the gate electrode 107. First and second semiconductor contact holes 116, which respectively expose the source region 103b and the drain region 103c, are formed through the first interlayer insulating layer 109a and the gate insulating layer 105.

The second interlayer insulating layer 109b is disposed on the source electrode 110a, the drain electrode 110b.

The color filters 106a, 106b and 106c and the light absorption material layer 200 are disposed on the second interlayer insulating layer 109b and in the red, green, blue and white pixel regions R-SP, G-SP, B-SP and W-SP, respectively.

The white light from the organic emitting layer 113 is filtered or converted by the red, green and blue color filters 106a, 106b and 106c in the red, green and blue pixel regions R-SP, G-SP and B-SP. In addition, the light absorption material layer 200 is positioned in the emission area EA of the white pixel region W-SP, a part of the white light from the organic emitting layer 113 is absorbed by the light absorption material layer 200 to increase the color temperature. As a result, red, green, blue and white lights are provided in the red, green, blue and white pixel regions R-SP, G-SP, B-SP and W-SP, respectively.

The light absorption material layer 200 in the white pixel region W-SP is white or transparent. For example, when the light absorption material layer 200 is transparent, the light absorption material layer 200 can include a binder resin selected from the group consisting of a polyester-based resin, an acryl-based resin, a polyurethane-based resin, a melamine-based resin, a polyvinylalcohole-based resin and an oxazole-based resin. It can be preferred that the binder resin is the acryl-based resin.

In addition, the light absorption material layer 200 includes at least one light absorption dye 210 dispersed in the binder resin. The light absorption dye 210 has a predetermined absorption wavelength. A main absorption wavelength of the light absorption dye 210 is about 500 to 640 nm. The light absorption dye 210 can include tetra-azaporphyrin (TAP), rhodamine, squalene or cyanine (CY)-based material.

In the OLED device 100 including the light absorption material layer 200 in the white pixel region W-SP, the color temperature and the black visual sensitivity are improved.

The OLED device 100 further includes a blue color filter pattern 220 around an edge of the emission area EA of the white pixel region W-SP. The blue color filter pattern 220 can be positioned in the non-emission area NEA.

The blue color filter pattern 220 surrounds the light absorption material layer 200 and can contact the light absorption material layer 200. In a plane view, the blue color filter pattern 220 can be positioned between the light absorption material layer 200 in the white pixel region W-SP and the red color filter 106a in the red pixel region R-SP and between the light absorption material layer 200 in the white pixel region W-SP and the blue color filter 106c in the blue pixel region B-SP and overlap the bank 119 in a plane view. Since the bank 119 is disposed at a boundary of each of the pixel regions R-SP, W-SP, B-SP and G-SP, the blue color filter pattern 220 can be disposed at the boundary of the white pixel region W-SP. In addition, the blue color filter pattern 220 can overlap the data line 110c and/or the gate line in a plane view.

In the white pixel region W-SP of the OLED device 100, the red light leakage is prevented and the blue light leakage is generated such that the color temperature of the OLED device 100 is further improved.

The overcoat layer 108 is disposed on the color filters 106a, 106b and 106c and the light absorption material layer 200. A drain contact hole 110d, which exposes the drain electrode 110b, is formed through the overcoat layer 108 and the second interlayer insulating layer 109b. A surface of the overcoat layer 108 provides a plurality of concave portions and a plurality of convex portions such that the micro-lens structure 117 is provided.

Since the micro-lens structure 117 is provided by the surface of the overcoat layer 108, the light out-coupling efficiency of the OLED device 100 is improved.

The first electrode 111, which is connected to the drain electrode 110b through the drain contact hole 110d, is disposed on the overcoat layer 108. The first electrode 111 can be formed of a conductive material having a relatively high work function to serve as an anode.

The first electrode 111 is separated in each pixel region R-SP, W-SP, B-SP and G-SP, and the bank 119 is disposed between adjacent first electrodes 111.

The organic emitting layer 113 is disposed on the first electrode 111, and the second electrode 115 as a cathode is disposed on the organic emitting layer 113.

When the voltages are applied to the first and second electrode 111 and 115, a hole from the first electrode 111 and an electron from the second electrode 115 are transferred into the organic emitting layer 113 to form an exciton. The exciton is transited from an excited state into a ground state such that the light is emitted from the emitting diode E.

The light from the emitting diode E passes through the first electrode 111 such that the OLED device 100 displays an image.

The concave portion 117b and the convex portion 117a on the surface of the overcoat layer 108 are reflected onto the first electrode 111, the organic material layer 113 and the second electrode 115 sequentially stacked on the overcoat layer 108 such that the micro-lens structure 117 is provided.

As mentioned above, in the OLED device 100 according to the first embodiment of the present invention, since the surface of the overcoat layer 108 forms the micro-lens structure 117 including the concave portion 117b and the convex portion 117a, the light out-coupling efficiency is improved.

Namely, a part of the light from the organic emitting layer 113 is totally reflected between the organic emitting layer 113 and the second electrode 115 such that the light is trapped in the space between the organic emitting layer 113 and the second electrode 115. However, in the OLED device 100 of the present invention, the light is incident to the micro-lens structure 117 in an angle being smaller than a critical angle of the total reflection such that the external emitting efficiency is increased by the multiple reflections. Accordingly, the light out-coupling efficiency of the OLED device 100 is improved.

In addition, since the light absorption material layer 200 in the white pixel region W-SP includes the light absorption dye 210 having a main absorption wavelength of about 500 to 640 nm, the color temperature of the OLED device 100 is improved and the black visual sensitivity is also improved.

Namely, since the light absorption dye 210 in the light absorption material layer 200 has a main absorption wavelength of about 500 to 640 nm, the yellow light of the light from the emitting diode E is absorbed by the light absorption dye 210 such that blue component is increased such that the color temperature is increased.

In addition, the reflectance and the light diffusion component in the white pixel region W-SP are lowered by the light absorption material layer 200 such that the black visual sensitivity is improved.

As mentioned above, the OLED device 100 includes the blue color filter pattern 220 at a side of the emission area EA of the white pixel region W-SP such that the color temperature is further improved.

In the OLED device 100 including the micro-lens structure 117, a part of the light from the organic emitting layer 113 is leaked toward metal lines such as the data line 110c on the substrate 101. The leaked light is reflected by the data line 110c and incident into the micro-lens structure 117 in adjacent pixel region.

For example, when the leaked light from the red pixel region R-SP, which is adjacent to the white pixel region W-SP, is incident to the micro-lens structure 117 in the white pixel region W-SP, not only the white light but also the leaked red light is emitted from the white pixel region W-SP such that the color temperature is decreased. Particularly, when the micro-lens structure 117 is included, the light from the organic emitting layer 113 is scattered such that the color temperature decrease by the light leakage from the red pixel region R-SP to the white pixel region W-SP can be seriously generated.

However, as shown in FIG. 6, in the OLED device 100 including the blue color filter pattern 220 in the edge of the emission area EA in the white pixel region W-SP, the light, which is emitted (or leaked) from the red pixel region R-SP through the red color filter 106a and reflected by the data line 110c toward the white pixel region W-SP, is absorbed by the blue color filter pattern 220. Namely, the red light leaked from the red pixel region R-SP is prevented being incident to the white pixel region W-SP. Accordingly, the decrease of the color temperature resulting from the light leakage of the red pixel region R-SP is prevented.

Namely, the blue color filter pattern 220 in the non-emission area NEA of the white pixel region W-SP serves as a blocking pattern for blocking the light from the red pixel region R-SP into the white pixel region W-SP.

In FIG. 6, the blue color filter pattern 220 is disposed in the non-emission area NEA of the white pixel region W-SP. Alternatively, a green color filter pattern or a black matrix pattern can be disposed in the non-emission area NEA of the white pixel region W-SP instead of the blue color filter pattern 220 to block the light from the red pixel region R-SP into the white pixel region W-SP.

Alternatively, to block the color temperature decreased by the light from the green pixel region G-SP into the white pixel region W-SP, the blue color filter pattern 220, a red color filter pattern or the black matrix pattern can be disposed in the non-emission area NEA of the white pixel region W-SP, i.e., at a side of the light absorption material layer 200.

In other words, one of the blue color filter pattern 220, the green color filter pattern and the black matrix pattern is formed at a side of the light absorption material layer 200 to block the color temperature decreased by the light from the red pixel region R-SP into the white pixel region W-SP, and one of the blue color filter pattern 220, the red color filter pattern and the black matrix pattern is formed at a side of the light absorption material layer 200 to block the color temperature decreased by the light from the green pixel region G-SP into the white pixel region W-SP.

On the other hand, as shown in FIG. 7, the white light emitted (or leaked) from adjacent red pixel region R-SP is reflected by the data line 110c and passes through the blue color filter pattern 220 such that blue light is incident to the white pixel region W-SP. Accordingly, in the white pixel region W-SP, not only the white light but also the blue light is emitted from the white pixel region W-SP such that the color temperature is improved.

Namely, without driving the blue pixel region B-SP to increase the color temperature, the blue component in the white pixel region W-SP is increased by the blue color filter pattern 220 such that the color temperature of the OLED device 100 is improved.

In FIGS. 5 to 7, the blue color filter pattern 220 contacts both the red color filter 106a and the light absorption material layer 200 and completely fills a space between the red color filter 106a and the light absorption material layer 200. Alternatively, the blue color filter pattern 220 can be spaced apart from at least one of the red color filter 106a and the light absorption material layer 200. For example, there can be a space between the blue color filter pattern 220 and the red color filter 106a, between the blue color filter pattern 220 and the light absorption material layer 200 or between the blue color filter pattern 220 and each of the red color filter 106a and the light absorption material layer 200, and the overcoat layer 108 can fill the space. Namely, a plane area of the blue color filter pattern 220 can be smaller than that of the space between the red color filter 106a and the light absorption material layer 200.

In the OLED device 100, the white light is blue-shifted by the light absorption dye 210 in the light absorption material layer 200 such that the color temperature is increased. In addition, the blue color filter pattern 220 is disposed around an edge of the emission area EA of the white pixel region W-SP and in the non-emission area NEA such that the decrease of the color temperature by the light leakage from the red pixel region R-SP is prevented. Moreover, the light leakage from the red pixel region R-SP is changed into blue light by the blue color filter pattern 220 such that the color temperature is further increased.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. An organic light emitting display device, comprising:
a substrate including a plurality of pixel regions;
a light absorption material layer in a white pixel region of the plurality of pixel regions, and including a light absorption dye;
an overcoat layer on the light absorption material layer;
a micro-lens structure at a top surface of the overcoat layer; and
an emitting diode on the micro-lens structure,
wherein the light absorption dye has a main absorption wavelength of about 500 to 640 nm.

2. The organic light emitting display device according to claim 1, wherein an area of the light absorption material layer is above about 40% of an area of an emission area of the white pixel region.

3. The organic light emitting display device according to claim 1, wherein the light absorption dye includes one or more of tetra-aza-porphyrin (TAP), rhodamine, squalene and cyanine (CY)-based material.

4. The organic light emitting display device according to claim 1, wherein the light absorption material layer is transparent or white.

5. The organic light emitting display device according to claim 1, further comprising a blue color filter pattern at a side of the light absorption material layer.

6. The organic light emitting display device according to claim 5, further comprising a bank at a boundary of the white pixel region,
wherein the blue color filter pattern overlaps the bank.

7. The organic light emitting display device according to claim 5, further comprising a metal line at a boundary of the white pixel region,
wherein the blue color filter pattern overlaps the metal line.

8. The organic light emitting display device according to claim 1, wherein the overcoat layer has a refractive index of about 1.5.

9. The organic light emitting display device according to claim 1, wherein the overcoat layer includes at least one of an acryl-based resin, a phenol-based resin, a polyamide-based resin, a polyimide-based resin, a unsaturated-polyester-based resin, a polyphenylene-based resin, a polyphenylenesulfide-based resin, a benzocyclobutene-based resin and photoresist.

10. The organic light emitting display device according to claim 1, wherein the plurality of pixel regions further include a red pixel region, a green pixel region and a blue pixel region, and a red color filter, a green color filter and a blue color filter are disposed in the red, green and blue pixel regions, respectively.

11. The organic light emitting display device according to claim 1, further comprising:
a thin film transistor in each of the plurality of pixel regions; and
an insulating layer between the thin film transistor and the overcoat layer,
wherein the light absorption material layer is disposed on the insulating layer.

12. The organic light emitting display device according to claim 1, wherein an area of the light absorption material layer is smaller than an area of an emission area of the white pixel region.

13. The organic light emitting display device according to claim 1, wherein the light absorption material layer includes a plurality of light absorption material patterns being spaced apart from each other.

14. The organic light emitting display device according to claim 13, wherein the plurality of light absorption material patterns are arranged along a direction to provide a stripe structure.

15. The organic light emitting display device according to claim 13, wherein each of the plurality of light absorption material patterns has a bar shape, and a side surface of the light absorption material pattern has an uneven shape.

16. The organic light emitting display device according to claim 1, wherein the light absorption material layer has a lattice shape and an opening therein to expose a part of the white pixel region.

17. The organic light emitting display device according to claim 1, further comprising:
one of a red color filter pattern, a green color filter pattern and a black matrix pattern at a side of the light absorption material layer.

18. An organic light emitting display device, comprising:
a substrate including a first pixel region of red or green and a second pixel region of white;
an emitting diode on the substrate and corresponding to the first and second pixel regions, the emitting diode emitting a white light;
a color filter in the first pixel region and between the substrate and the emitting diode; and
a blue color filter pattern on the substrate and under the emitting diode,
wherein the blue color filter pattern is positioned between the first and second pixel regions.

19. The organic light emitting display device according to claim 18, further comprising:
a bank positioned between the first and second pixel regions and covering an edge of a first electrode of the emitting diode,
wherein the blue color filter pattern overlaps the bank.

20. The organic light emitting display device according to claim 18, further comprising:
a light absorption material layer in the second pixel region and including a light absorption dye,
wherein the blue color filter pattern is positioned between the color filter and the light absorption material layer, and the light absorption dye has a main absorption wavelength of about 500 to 640 nm.

* * * * *